(12) United States Patent
Li

(10) Patent No.: US 10,431,691 B2
(45) Date of Patent: *Oct. 1, 2019

(54) THIN FILM TRANSISTOR AND METHOD FOR MANUFACTURING THIN FILM TRANSISTOR, AND LIQUID CRYSTAL DISPLAY PANEL

(71) Applicant: Wuhan China Star Optoelectronics Semiconductor Display Technology Co., Ltd., Wuhan, Hubei (CN)

(72) Inventor: Songshan Li, Guangdong (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 15/737,302

(22) PCT Filed: Oct. 20, 2017

(86) PCT No.: PCT/CN2017/106973
§ 371 (c)(1),
(2) Date: Dec. 17, 2017

(87) PCT Pub. No.: WO2019/029008
PCT Pub. Date: Feb. 14, 2019

(65) Prior Publication Data
US 2019/0043994 A1 Feb. 7, 2019

(30) Foreign Application Priority Data
Aug. 7, 2017 (CN) .......................... 2017 1 0674521

(51) Int. Cl.
*H01L 29/786* (2006.01)
*H01L 29/417* (2006.01)
(Continued)

(52) U.S. Cl.
CPC .. *H01L 29/78618* (2013.01); *H01L 29/41733* (2013.01); *H01L 29/66553* (2013.01);
(Continued)

(58) Field of Classification Search
CPC ......... H01L 29/78618; H01L 21/02672; H01L 21/324; H01L 29/458; H01L 29/41733;
(Continued)

(56) References Cited

U.S. PATENT DOCUMENTS

2008/0303030 A1* 12/2008 Sakai .................. H01L 27/1214
257/72

\* cited by examiner

*Primary Examiner* — Thanh Y. Tran
(74) *Attorney, Agent, or Firm* — Andrew C. Cheng

(57) ABSTRACT

The present application discloses a thin film transistor, a method for manufacturing a thin film transistor and a liquid crystal display panel, and relates to a display technology field. The thin film transistor includes a substrate, a gate electrode layer and an insulating layer, the gate electrode layer is formed on the substrate, the insulating layer is covered on the gate layer; a semiconductor layer is formed on the insulating layer; a conductor layer is formed on the semiconductor layer; an insulating spacer layer is formed on the insulating layer; a source-drain electrode layer is formed on the conductor layer and the insulating spacer layer; a passivation layer formed on the source-drain electrode layer and the semiconductor layer; wherein the insulating spacer layer is located between the source-drain electrode layer and the semiconductor layer to solve the leakage current too large problem of the thin film transistor.

8 Claims, 7 Drawing Sheets

(51) Int. Cl.
*H01L 29/66* (2006.01)
*H01L 21/02* (2006.01)
*H01L 21/265* (2006.01)

(52) U.S. Cl.
CPC .. *H01L 29/66765* (2013.01); *H01L 29/78696* (2013.01); *H01L 21/0262* (2013.01); *H01L 21/02238* (2013.01); *H01L 21/02244* (2013.01); *H01L 21/02532* (2013.01); *H01L 21/02592* (2013.01); *H01L 21/02672* (2013.01); *H01L 21/26513* (2013.01)

(58) Field of Classification Search
CPC ......... H01L 21/26513; H01L 21/02592; H01L 21/0262
See application file for complete search history.

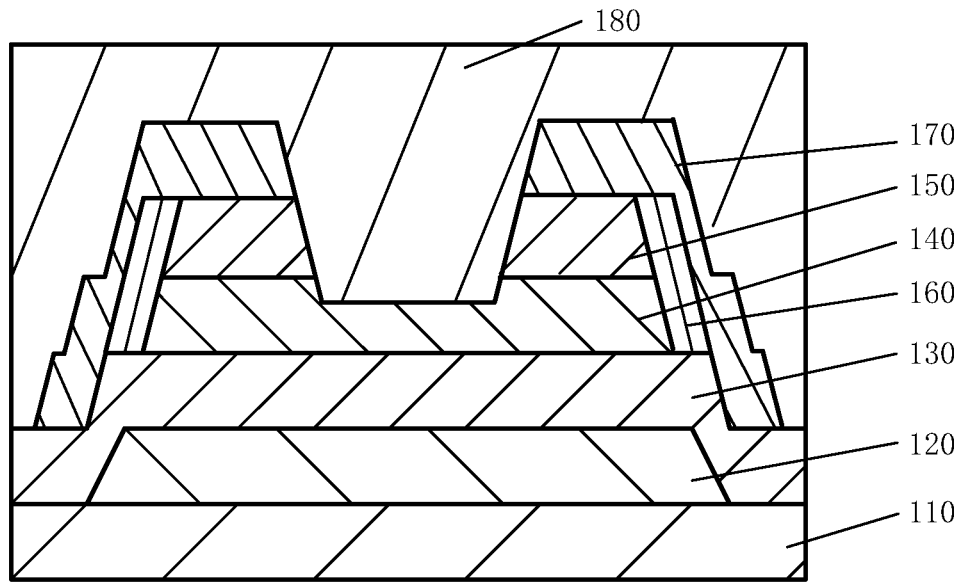

FIG. 8

Depositing the insulating material on the conductor layer and the insulating layer, performing patterning treatment to the insulating material, removing the insulating material on the conductor layer, and forming the insulating spacer layer on the insulating layer — S242

Disposing a passivation layer on the source-drain electrode layer and the semiconductor layer — S252

FIG. 9

THIN FILM TRANSISTOR AND METHOD FOR MANUFACTURING THIN FILM TRANSISTOR, AND LIQUID CRYSTAL DISPLAY PANEL

FIELD OF THE INVENTION

The present application relates to a display technology field, and more particularly to thin film transistor and method for manufacturing thin film transistor, and liquid crystal display panel.

BACKGROUND OF THE INVENTION

Thin film transistor, TFT is widely used in liquid crystal display, LCD and active matrix organic light-emitting diode, AMOLED, therefore, thin film transistors affect the development of the display industry. However, in the conventional method for manufacturing the thin film transistor, the thin film transistor formed has a problem that the leakage current is too large, resulting in the influence of the characteristics of the thin film transistor.

SUMMARY OF THE INVENTION

The embodiment of the present application provides a thin film transistor and a method for manufacturing the thin film transistor and a liquid crystal display panel to solve the problem that the leakage current of the thin film transistor is excessively large.

In order to solve the above technical problem, a technical aspect adapted by the embodiment of the present application is to provide a thin film transistor, the thin film transistor including: a substrate, a gate electrode layer and an insulating layer, the gate electrode layer disposed on the substrate, the insulating layer covered the gate electrode layer; a semiconductor layer disposed on the insulating layer; a conductor layer disposed on the semiconductor layer; an insulating spacer layer disposed on the insulating layer; a source-drain electrode layer disposed on the conductor layer and the insulating spacer layer; a passivation layer disposed on the source-drain electrode layer and the semiconductor layer; wherein the insulating spacer layer disposed between the source-drain electrode layer and the semiconductor layer.

In order to solve the above technical problem, another technical aspect adapted by the embodiment of the present application is to provide a method for manufacturing a thin film transistor, including: a substrate; disposing a gate electrode layer and an insulating layer on the substrate, the insulating layer covered the gate electrode layer; deposing a semiconductor layer and a conductor layer sequentially on the insulating layer; deposing an insulating spacer layer on the insulating layer; disposing a source-drain electrode layer on the conductor layer and the insulation spacer layer; wherein the insulating spacer layer is located between the source-drain electrode layer and the semiconductor layer; disposing a passivation layer on the source-drain electrode layer and the semiconductor layer.

In order to solve the above technical problem, another technical aspect adapted by the embodiment of the present application is to provide a liquid crystal display panel including a thin film transistor, wherein the thin film transistor includes:

a substrate, a gate electrode layer and an insulating layer, the gate electrode layer is disposed on the substrate, the insulating layer is covered the gate electrode layer; a semiconductor layer is disposed on the insulating layer; a conductor layer is disposed on the semiconductor layer; the semiconductor layer includes a channel region, the channel region divides the semiconductor layer into left and right portions, the conductor layer is disposed on the left and right portions of the semiconductor layer to form two island structures;

an insulating spacer layer is disposed on the insulating layer;

a source-drain electrode layer is disposed on the conductor layer and the insulating spacer layer;

a passivation layer is disposed on the source-drain electrode layer and the semiconductor layer;

wherein the insulating spacer layer is disposed between the source-drain electrode layer and the semiconductor layer;

the gate electrode layer and the source-drain electrode layer are metal material; and the insulating layer, the insulating spacer layer and the passivation layer are insulating material.

The advantages of the present application is by disposing the gate electrode layer and the insulating layer on the substrate, the insulating layer is covered the gate electrode layer, the semiconductor layer and the conductor layer are sequentially disposed on the insulating layer; an insulating spacer layer is disposed on the insulating layer; a source-drain electrode layer is disposed on the conductor layer and the insulating spacer layer; wherein the insulating spacer layer is located between the source-drain electrode layer and the semiconductor layer; by disposing the insulating spacer layer between the source-drain electrode layer and the semiconductor layer to prevent the source-drain electrode layer from being directly connected with the semiconductor layer, therefore to achieve the phenomenon of reducing leakage current, improve the characteristics of thin film transistors.

BRIEF DESCRIPTION OF THE DRAWINGS

In order to more clearly illustrate the embodiments of the present application or prior art, the following FIGS. will be described in the embodiments are briefly introduced. It is obvious that the drawings are merely some embodiments of the present application, those of ordinary skill in this field can obtain other FIGS. according to these FIGS. without paying the premise.

FIG. 8 is a schematic structural view of the thin film transistor formed after steps S231 to S251 of the first way to form the insulating spacer layer shown in FIG. 7;

FIG. 9 is a schematic flow diagram of the insulating spacer layer formed by the second way of the method for manufacturing the thin film transistor shown in FIG. 4;

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

In the description of the present invention, the meaning of "plural" is at least two, such as two, three, etc., unless otherwise specifically defined. In addition, the terms "comprising"; and "having"; and any variations thereof are intended to cover non-exclusive inclusion. Such as a process, method, system, product, or device that includes a series of steps or units, is not limited to the listed steps or units, but optionally also includes steps or units not listed, or alternatively other steps or units inherent to these processes, methods, products, or equipment.

Reference to "an embodiment" in this context means that a particular feature, structure, or characteristic described in connection with the embodiments may be included in at least one embodiment of the present invention. The appearances of the phrases at various locations in the specification do not necessarily refer to the same embodiments, nor are they separate or alternative embodiments that are mutually exclusive with other embodiments. It will be apparent to those skilled in the art that the embodiments described herein may be combined with other embodiments.

Figure 1:
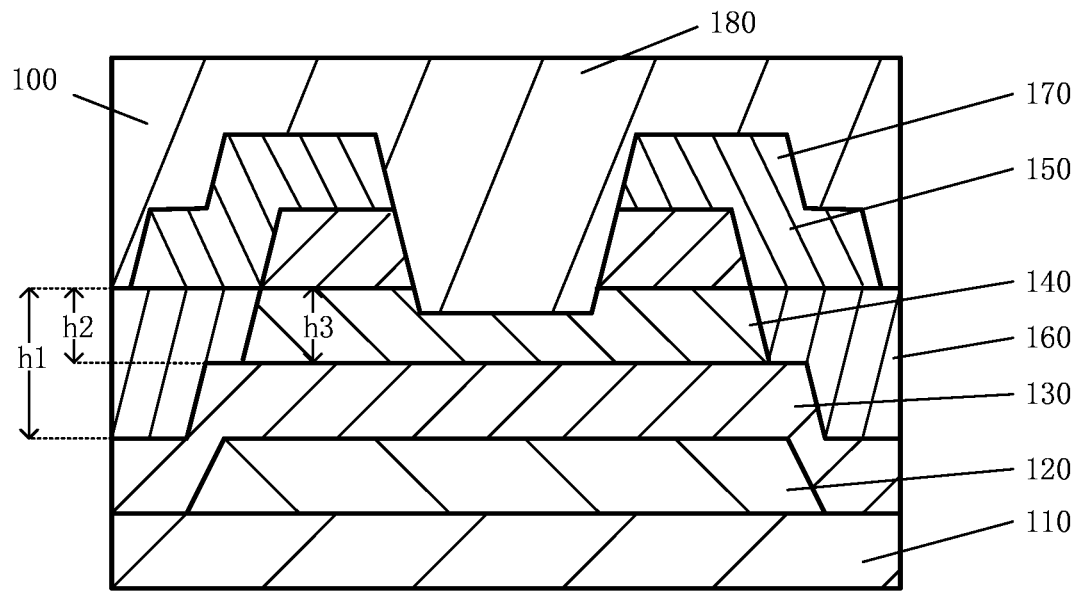
FIG. 1 is a schematic structural view of a thin film transistor according to an embodiment of the present application.
Figure 2:
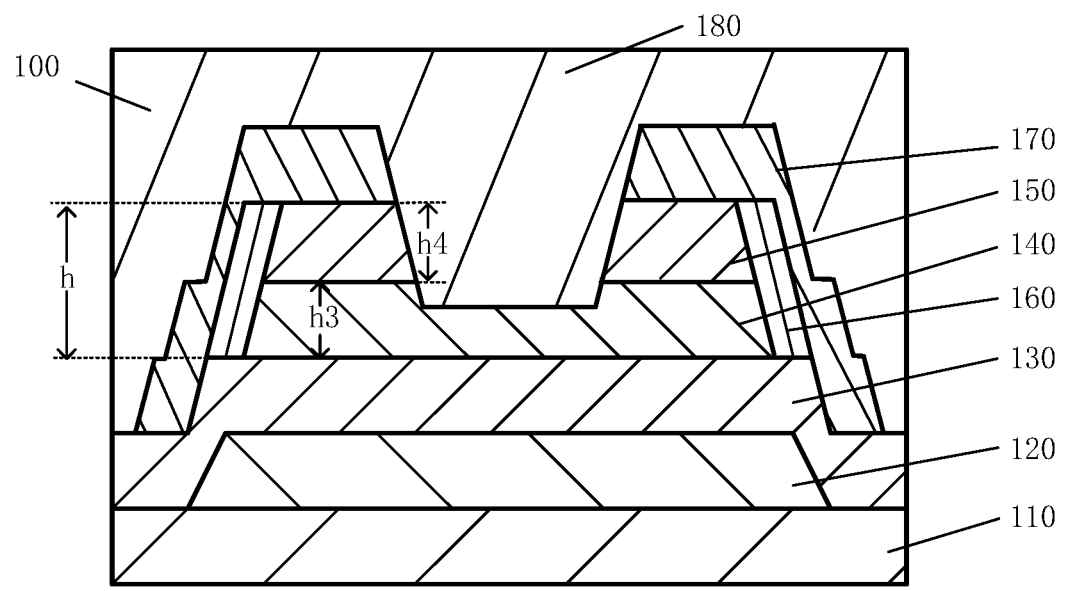
FIG. 2 is a schematic structural view of a thin film transistor according to another embodiment of the present application.

Referring to FIGS. 1-2, FIG. 1 is a schematic structural view of a thin film transistor according to an embodiment of the present application; FIG. 2 is a schematic structural view of a thin film transistor according to another embodiment of the present application.

In the embodiment of FIGS. 1 and 2, the difference between the thin film transistors is only in the shapes of the insulating spacer layers, and therefore both embodiments of FIGS. 1 and 2 are designated by the same reference characters.

The thin film transistor 100 includes a substrate 110, a gate electrode layer 120, an insulating layer 130, a semiconductor layer 140, a conductor layer 150, an insulating spacer layer 160, a source-drain electrode layer 170, and a passivation layer 180.

The thin film transistor 100 is a laminated structure, the layers above are sequentially disposed on the substrate 110, the substrate 110 may be a glass substrate. Wherein, the gate electrode layer 120 is disposed on the substrate 110, the insulating layer 130 is covered the gate electrode layer 120. In this embodiment, the thin film transistor 100 is a bottom gate structure.

The semiconductor layer 140 is as an active layer of the thin film transistor 100 and disposed on the insulating layer 130; the conductor layer 150 is disposed on the semiconductor layer 140 for connecting the semiconductor layer 140 and the source-drain electrode layer 170; a current is formed between the source-drain electrode layer 170 through the conductive layer 150 and by the semiconductor layer 140, in this embodiment, the resistance of the conductor layer 150 is smaller, compared to the source-drain electrode layer 170 directly connected to the semiconductor layer 140 to reduce the leakage current condition between the source-drain electrode layer 170 and the semiconductor layer 140.

The insulating spacer layer 160 is further disposed on the insulating layer 130 in the present embodiment, that is, the insulating spacer layer 160 is disposed on the same layer with the semiconductor layer 140; the source-drain electrode layer 170 is disposed on the conductor layer 150 and the insulating spacer layer 160, and the insulating spacer layer 160 is located between the semiconductor layer 140 and the source-drain electrode layer 170.

In the embodiment, the conductor layer 150 and the insulating spacer layer 160 are provided between the semiconductor layer 140 and the source-drain electrode layer 170, that is, the semiconductor layer 140 and the source-drain electrode layer 170 is not directly contacting and connected, so that the leakage current between the semiconductor layer 140 and the source-drain electrode layer 170 can be effectively reduced.

The semiconductor layer 140 has a channel region 141, the channel region 141 divides the semiconductor layer 140 into left and right portions, the conductor layer 150 is disposed on the left and right portions of the semiconductor layer 140 to form two island structures. The source-drain electrode layer 170 disposed on the two island structures of the conductor layer 150 are also divided into a source electrode and a drain electrode.

The passivation layer 180 is disposed on the source-drain electrode layer 170 and the semiconductor layer 140, specifically is disposed on the channel region 141 of the semiconductor 140 and is formed between the two island structures of the conductor layer 150.

For the structure of the thin film transistor 100 described above, the insulating layer 130, the insulating spacer layer 160, and the passivation layer 180 are all insulating materials, and may be silicon oxide or silicon nitride. The gate electrode layer 120 and the source-drain electrode layer 170 are metal materials, and may be metal materials such as molybdenum and aluminum, etc., and may also be a combination of three layers of molybdenum-aluminum-molybdenum metal materials. The semiconductor layer 140 may be polysilicon, and the conductor layer 150 may be a P+ conductor layer formed of polysilicon doped with Boron ions.

In addition, the insulating spacer layer 160 of the present application may be disposed on the insulating layer 130 in a variety of ways, for example, in the two types shown in FIGS. 1 and 2.

As shown in FIG. 1, the insulating spacer layer 160 is disposed on the insulating layer 130, and has a first thickness h1 and a second thickness h2, the second thickness h2 is smaller than the first thickness h1, and the second thickness h2 is greater than or equal to the thickness h3 of the semiconductor layer 140, the second thickness h2 of the insulating spacer layer in FIG. 1 is equal to the thickness h3 of the semiconductor layer 140. The structure of the insulating spacer layer 160 shown in FIG. 1 makes the source-drain electrode layer 170 not disposed on the insulating layer 130, and then increases to the distance between the source-drain electrode layer 170 and the gate electrode layer 120, to prevent breakdown, and to reduce the parasitic capacitance between the source-drain electrode layer 170 and the gate electrode layer 120. In FIG. 1, the formed passivation layer 180 is further disposed on the insulating spacer layer 160.

As shown in FIG. 2, the insulating spacer layer 160 is disposed on the side face of the semiconductor layer 140 and the conductor layer 150, and is disposed on the insulating layer 130, the thickness h thereof may be greater than or equal to the thickness h3 of the semiconductor layer 140. The thickness h of the insulating spacer layer in FIG. 2 is greater than the thickness h3 of the semiconductor layer 140, and is equal to the combination thickness h3+h4 of both the semiconductor layer 140 and the conductor layer 150. The structure of the insulating spacer layer 160 shown in FIG. 2 makes the source-drain electrode layer 170 further disposed on the insulating layer 130, the insulating spacer layer 160 is capable of disposed between the conductor layer 150 and the source-drain electrode layer 170, the passivation layer 180 is further disposed on the insulating layer 130.

In the above embodiment, the insulating spacer layer is located between the source-drain electrode layer and the semiconductor layer to prevent the direct contact between the source-drain electrode layer and the semiconductor layer to reduce the leakage current, thereby improving the performance of the thin film transistor.

Figure 3:
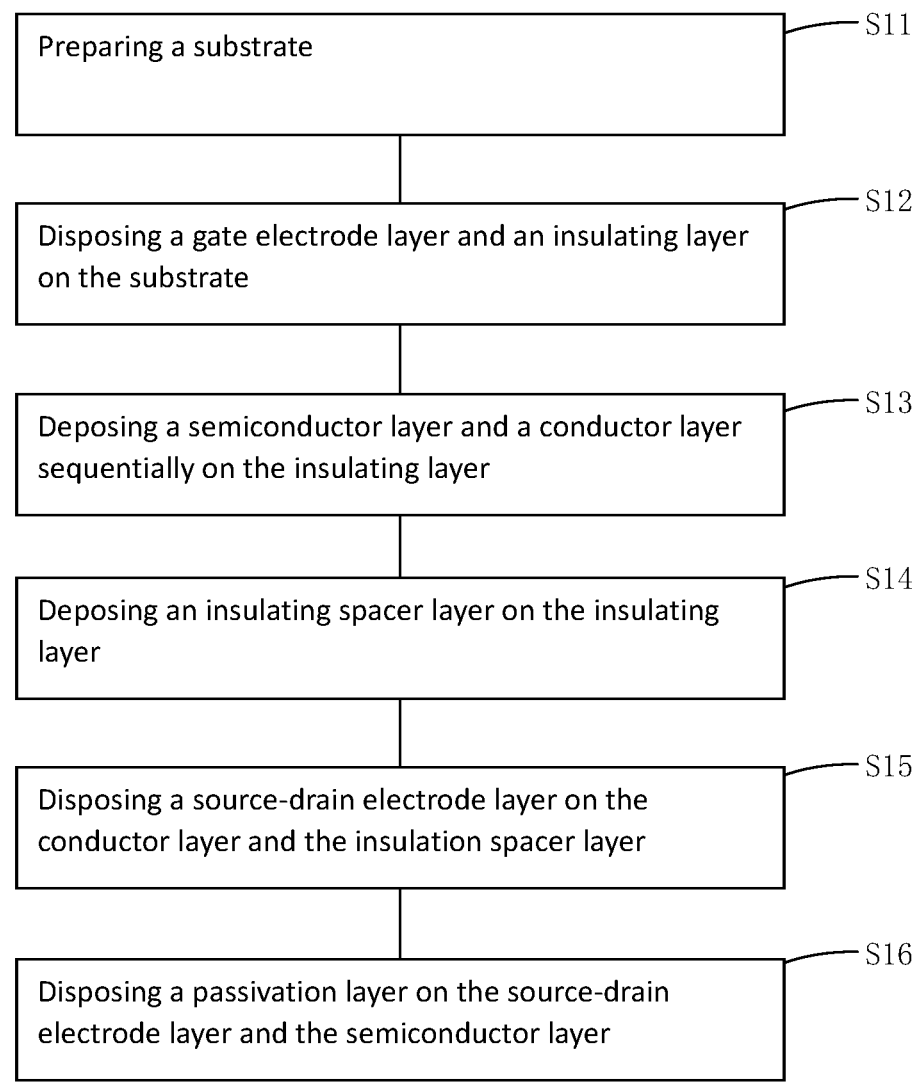
FIG. 3 is a schematic flow diagram of a method for manufacturing a thin film transistor according to an embodiment of the present application.

In order to obtain the thin film transistor described above, the present application also provides a method for manufacturing the thin film transistor, referring to FIG. 3, FIG. 3 is a schematic flow diagram of the method for manufacturing the thin film transistor according to an embodiment of the present application. In the present embodiment, the method for manufacturing the thin film transistor may include the following steps of:

S11: preparing the substrate.

The substrate for manufacturing the thin film transistor is prepared, the substrate may be a glass substrate.

S12: disposing a gate electrode layer and an insulating layer on the substrate.

In this step S12, a metal layer is deposited and patterned on the glass substrate prepared in the above-described step S11 to form the gate electrode layer, the metal material to form the gate electrode layer in the present embodiment is molybdenum, in other embodiments, other metal materials can be used; an insulating layer is disposed on the formed gate electrode layer, wherein the insulating layer is covered on the gate electrode layer, that is, the gate electrode layer is formed between the substrate and the insulating layer, the material of the insulating layer in this embodiment is silicon oxide, in other embodiments, silicon nitride or other material capable of achieving the purpose of insulation can be used. The glass substrate formed in this step is used in the following step S13.

S13: depositing a semiconductor layer and a conductor layer sequentially on the insulating layer.

In this step S13, the semiconductor layer and the conductor layer are further disposed on the glass substrate obtained in the above-described step S12. Specifically, the semiconductor layer is disposed on the upper surface of the insulating layer, the conductor layer is further disposed on the upper surface of the semiconductor layer, the semiconductor layer is disposed on the upper surface of the insulating layer, that is, the insulating layer is between the semiconductor layer and the gate electrode layer, the semiconductor layer is between the insulating layer and the conductor layer.

S14: deposing an insulating spacer layer on the insulating layer.

In this step S14, the processing is continued on the glass substrate obtained by the above-mentioned step S13, after forming the conductor layer and the semiconductor layer in the above-described step S13, a layer of the insulating spacer layer is disposed on the insulating layer, the insulating spacer layer is formed at both terminals of the semiconductor layer, and height of the portion of the insulating spacer layer in contact with the semiconductor layer is greater than or equal to the height of the semiconductor layer.

S15: disposing a source-drain electrode layer on the conductor layer and the insulation spacer layer.

In this step S15, the processing is continued on the glass substrate obtained by the above-mentioned step S14. After the insulating spacer layer is formed in the above-described step S14, a source-drain electrode layer is disposed on the conductor layer and the insulating spacer layer, the insulating spacer layer is located at both terminals of the semiconductor layer, and is also located between the source-drain electrode layer and the semiconductor layer.

S16: disposing a passivation layer on the source-drain electrode layer and the semiconductor layer.

In this step S16, the processing is continued on the glass substrate obtained by the above-mentioned step S15. After the source-drain electrode layer is provided in the above step, a channel is further formed by the combination of the source-drain electrode layer, the conductor layer and the upper surface of the semiconductor layer, the passivation layer is disposed on the source-drain electrode layer and the semiconductor layer to complete the manufacturing of the thin film transistor, the passivation layer is disposed above the source-drain electrode layer and the semiconductor layer, and is in contact with the conductor layer, that is the passivation layer is covered on the channel to have a protective effect.

The method for manufacturing the thin film transistor of the present embodiment includes preparing the substrate, disposing the gate electrode layer and the insulating layer on the substrate, disposing the semiconductor layer and the conductor layer sequentially on the insulating layer, disposing the insulating spacer layer on the insulating layer, disposing the source-drain electrode layer on the conductor layer and the insulating spacer layer, disposing the passivation layer on the source-drain electrode layer and the semiconductor layer, by disposing the insulating spacer layer on the insulating layer, the insulating spacer layer having a height greater than or equal to the height of the semiconductor layer is formed at both terminals of the semiconductor layer, and has an effect of preventing the contacting of the source-drain electrode layer and the semiconductor layer resulting in the condition of increasing leakage path, and to reduce the leakage current.

Figure 4:
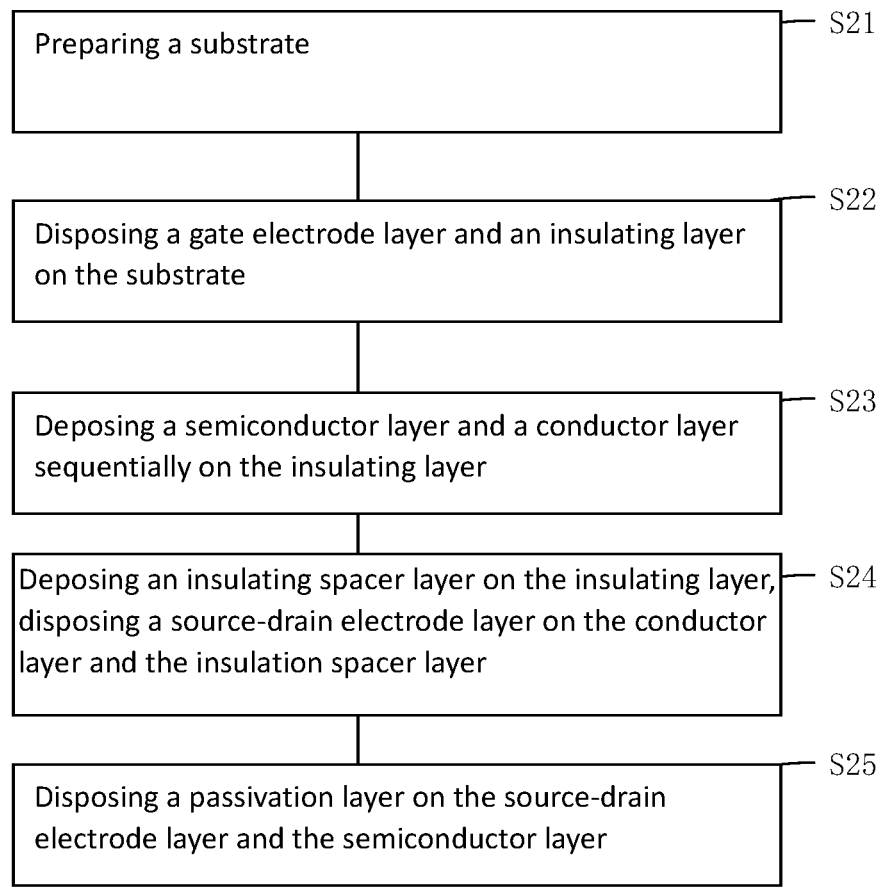
FIG. 4 is a schematic flow diagram of a method for manufacturing a thin film transistor according to another embodiment of the present application.

Referring to FIG. 4, FIG. 4 is a schematic flow diagram of a method for manufacturing a thin film transistor according to another embodiment of the present application. In the present embodiment, the method for manufacturing the thin film transistor may include the steps of:

S21: preparing the substrate.

The substrate for manufacturing the thin film transistor is prepared, the substrate may be a glass substrate.

S22: disposing a gate electrode layer and an insulating layer on the substrate.

In this step S22, the gate electrode layer and the insulating layer are first disposed on the glass substrate, and specifically, a layer of metal is deposited on the glass substrate by Physical Vapor Deposition, PVD technique and is patterned to form the gate electrode layer, the metal material forming the gate electrode layer in the present embodiment is molybdenum, of course other metal materials may be used in other embodiments; followed, a layer of insulating material is deposited by Plasma Enhanced Chemical Vapor Deposition, PECVD technique to form the insulating layer, the insulating layer is covered on the gate electrode layer, i.e., the gate electrode layer is formed between the glass substrate and the insulating layer. In this embodiment, the material of the insulating layer is silicon oxide, in other embodiments may also be silicon nitride or other materials capable of achieving insulation purposes.

Figure 5:
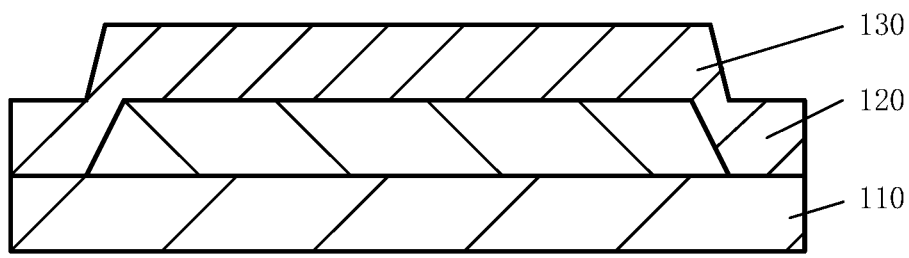
FIG. 5 is a schematic structural view of a glass substrate formed in step S22 of the method for manufacturing the thin film transistor shown in FIG. 4.

After completion of the step S22, a glass substrate having a gate layer and an insulating layer formed thereon is obtained, in can be understood in conjunction with FIG. 5, FIG. 5 is a schematic structural view of a glass substrate formed in step S22 of the method for manufacturing the thin film transistor shown in FIG. 4; FIG. 5 shows the glass substrate 110, the gate layer 120, the insulating layer 130, the gate layer 120 is disposed on the substrate 110, and the insulating layer 130 is covering the gate layer 120.

S23: forming a semiconductor layer and a conductor layer sequentially on the insulating layer.

In this step S23, the semiconductor substrate and the conductor layer are continuously disposed on the glass substrate obtained in the above-mentioned step S22. Specifically, an amorphous silicon material is deposited on the insulating layer by the PECVD technique, and the amorphous silicon material is carried out a dopant treatment and a crystallization treatment to form a polycrystalline silicon material adjacent to the insulating layer and a conductor material remote from the insulating layer, specifically, a specific dose of Boron ions is implanted by an ion implantation technique in the amorphous silicon material, in the present embodiment, the implantation dose of Boron ions can be set according to the actual requirements, for example, 0.1 ml, 0.5 ml, 1 ml, etc., and heated at 650° C. (±50° C.) for 15 min (±1 min) by rapid heating technique to crystallization. The temperature and the time of heating can be set according to the actual situation. In the present embodiment, the amorphous silicon is crystallized by heating at a temperature of 650° C. for 15 minutes by rapid heating technique, since the upper surface contains more Boron ions, the crystallization temperature and time will be reduced, so the crystallization direction is from top to down to form the conductive material away from the insulating layer and the polycrystalline silicon material adjacent to the insulating layer, patterning the polycrystalline silicon material and the conductive material to obtain the semiconductor layer and the conductor layer.

Figure 6:
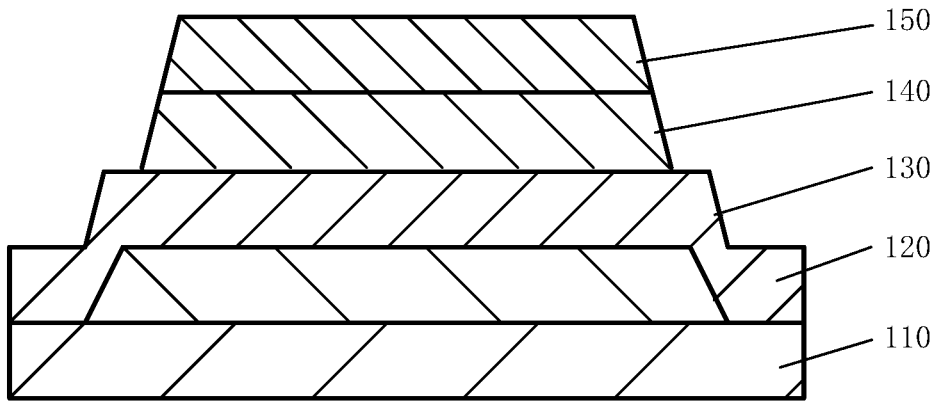
FIG. 6 is a schematic structural view of the glass substrate formed in step S23 of the method for manufacturing the thin film transistor shown in FIG. 4.

The step S23 can be understood in conjunction with FIG. 6, FIG. 6 is a schematic structural view of the glass substrate formed in step S23 of the method for manufacturing the thin film transistor shown in FIG. 4; FIG. 6 shows the semiconductor layer 140 is disposed on the insulating layer 130, the conductor layer 150 is disposed on the semiconductor layer 140, and the other reference characters are the same as those designated in FIG. 5.

S24: disposing an insulating spacer layer on the insulating layer, and disposing a source-drain electrode layer on the conductor layer and the insulating spacer layer.

S25: disposing a passivation layer on the source-drain electrode layer and the semiconductor layer.

In step S24, an insulating spacer layer and a source-drain electrode layer are disposed on the insulating layer disposed on the glass substrate obtained in the above-described step S23. In the present embodiment, the insulating spacer layer is formed in a plurality of ways, and the formation of the insulating spacer layer is related to the difference between the step S23 and the step S25, therefore the following description will be made with respect to the steps S23 to S25, and the two forming ways S231 to S251 and S242 to S252 are given below.

Figure 7:
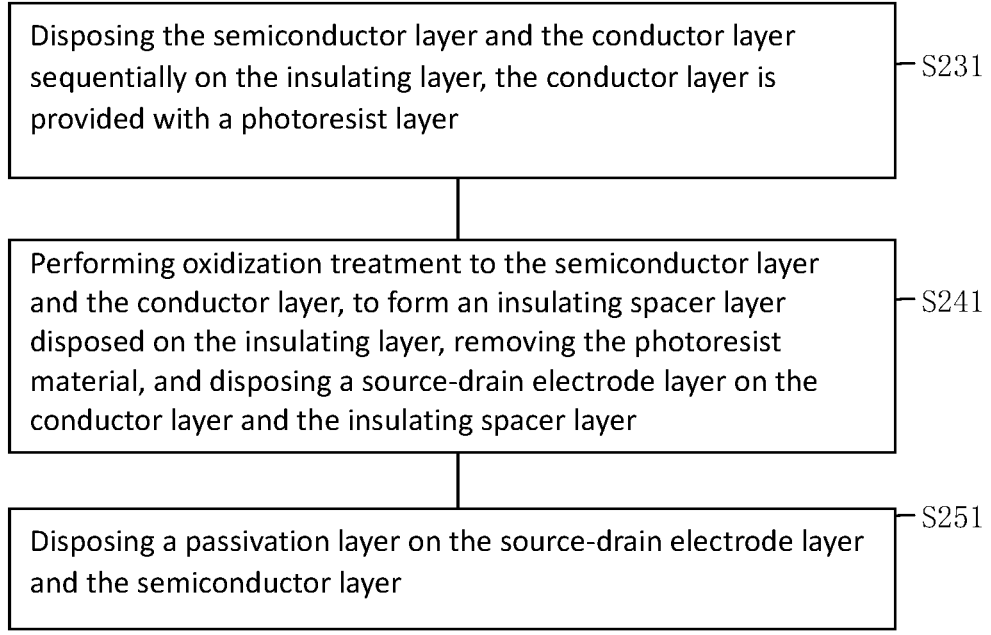
FIG. 7 is a schematic flow diagram of the insulating spacer layer formed by the first way of the method for manufacturing the thin film transistor shown in FIG. 4.

For the case of the first insulating spacer layer, referring to FIG. 7, FIG. 7 is a schematic flow diagram of the insulating spacer layer formed by the first way of the method for manufacturing the thin film transistor shown in FIG. 4.

S231: disposing the semiconductor layer and the conductor layer sequentially on the insulating layer, the conductor layer is provided with a photoresist layer.

S241: performing oxidization treatment to the semiconductor layer and the conductor layer, to form the insulating spacer layer disposed on the insulating layer, removing the photoresist material, and disposing the source-drain electrode layer on the conductor layer and the insulating spacer layer.

Specifically, by disposing the semiconductor layer and the conductor layer sequentially in step S231, a layer of the photoresist material is covered on the conductor layer, and the conductor layer region is defined by exposure and dry etching, at this time the photoresist material does not have to be removed first, the semiconductor layer and the conductor layer are subjected to an oxidation treatment in step S241 to form the insulating spacer layer disposed on the insulating layer. In the present embodiment, the oxidation treatment is performed by treating the sidewalls of the semiconductor layer with oxygen or other ions to form a silicon oxide layer on the sidewall, i.e., the insulating spacer layer, the insulating spacer layer is further disposed on the insulating layer, wherein the height of the insulating spacer layer is greater than or equal to the height of the sidewalls of the semiconductor layer.

After forming the insulating spacer layer, the photoresist material can be removed and the source-drain electrode layer can be disposed. Specifically, after removing the photoresist material, a layer of metal material laminated by molybdenum-aluminum-molybdenum is deposited by the PVD technique, and the pattern treatment is performed to form the source-drain electrode layer, at this time the source-drain electrode layer is only in contact with the upper surface of the conductor layer, the insulating spacer layer is located between the source-drain electrode layer and the semiconductor layer, and the sidewall of the source-drain electrode layer is blocked by the insulating spacer layer and is not in contact with the semiconductor layer.

S251: disposing the passivation layer on the source-drain electrode layer and the semiconductor layer.

In step S251, a channel is formed on the glass substrate obtained in the above-described step S241, and a passivation layer is disposed on the source-drain electrode layer and the semiconductor layer, and the passivation layer is used for protecting the channel of the formed thin film transistor.

Specifically, the source-drain electrode layer formed in the above-described step S24 is metal electrode, and are used as a mask to perform dry etching to the conductor layer and to form the channel, the conductor layer on the upper surface of the channel is removed, the lower portion of the channel semiconductor layer is retained, thereby obtaining the thin film transistor, at this time the passivation material is deposited by PECVD, and is patterned to form a passivation layer, the passivation material may be silicon oxide or other material, the passivation material in this embodiment is silicon oxide.

Combined referring to FIG. 8, FIG. 8 is a schematic structural view of the thin film transistor formed after steps S231 to S251 of the first way to form the insulating spacer layer shown in FIG. 7; the semiconductor layer 140 is disposed on a side of the insulating layer 130 away from the gate electrode layer 120. The conductive layer 150 is disposed on a side the semiconductor layer 140 away from the insulating layer 130. The insulating spacer layer 160 is disposed on the sidewall of the semiconductor layer 140 and further disposed on the insulating layer 130, the source-drain electrode layer 170 is disposed above the conductor layer 150 and the insulating spacer layer 160, and furthermore, the source-drain electrode layer 170 is formed above the insulating layer 130. The passivation layer 180 is disposed above the source-drain electrode layer 170, the semiconductor layer 140, and the insulating layer 130, and the other reference characters in FIG. 8 are the same as those designated in FIG. 6.

For the second case of forming the insulating spacer layer, referring to FIG. 9, FIG. 9 is a schematic flow diagram of the insulating spacer layer formed by the second way of the method for manufacturing the thin film transistor shown in FIG. 4.

S242: depositing the insulating material on the conductor layer and the insulating layer, performing a patterning treatment to the insulating material, removing the insulating material on the conductor layer, and forming the insulating spacer layer on the insulating layer.

Specifically, the layer of the insulating spacer layer is deposited on the conductor layer formed in the above-mentioned step S23 and the insulating layer formed in step S22, in this embodiment, the insulating material may be silicon oxide or silicon nitride, the thickness of the insulating material is greater than or equal to the thickness of the semiconductor layer, the insulating material is patterned by exposure and dry etching, removing the insulating material on the conductor layer, to form an layer of insulating material of silicon oxide or silicon nitride at both terminals of the semiconductor layer, that is the insulating spacer layer, at this time, the insulating spacer layer is further disposed on the insulating layer.

After forming the insulating spacer layer, the source-drain electrode layer is further disposed. Specifically, after removal of the photoresist material, a layer of metal material laminated by molybdenum-aluminum-molybdenum is deposited by the PVD technique, and the pattern treatment is performed to form the source-drain electrode layer, at this time the source-drain electrode layer is only in contact with the upper surface of the conductor layer, the insulating spacer layer is located between the source-drain electrode layer and the semiconductor layer, and the sidewall of the source-drain electrode layer is blocked by the insulating spacer layer and is not in contact with the semiconductor layer.

S252: disposing the passivation layer on the source-drain electrode layer and the semiconductor layer.

In step S252, a channel is formed on the glass substrate obtained in the above-described step S242, and the passivation layer is disposed on the source-drain electrode layer and the semiconductor layer, and the passivation layer is used for protecting the channel of the formed thin film transistor.

Specifically, the source-drain electrode layer formed in the above-described step S24 is metal electrode, and are used as a mask to perform dry etching to the conductor layer and to form the channel, the conductor layer on the upper surface of the channel is removed, the lower portion of the channel semiconductor layer is retained, thereby obtaining the thin film transistor, at this time the passivation material is deposited by PECVD, and is patterned to form a passivation layer, the passivation material may be silicon oxide or other material, the passivation material in this embodiment is silicon oxide.

Figure 10:
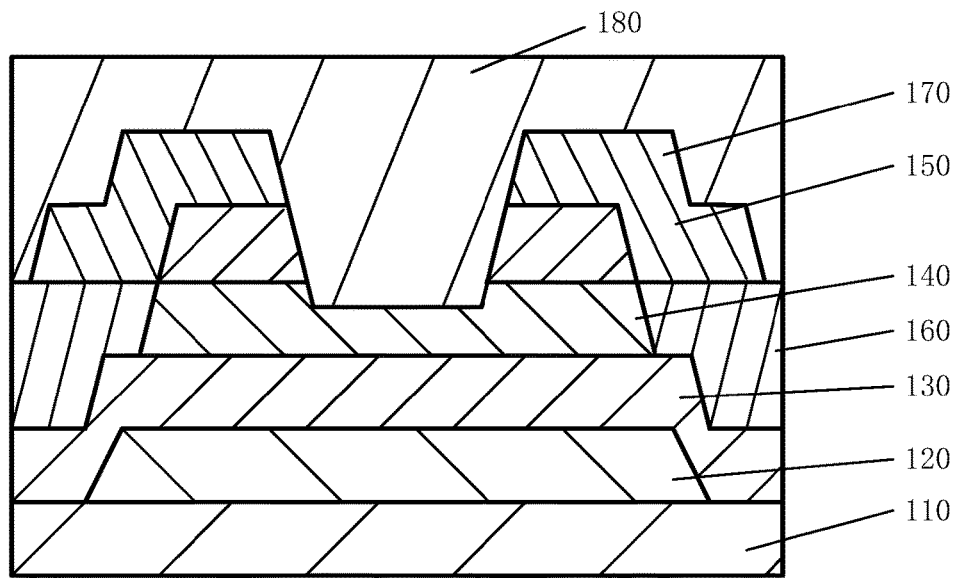
FIG. 10 is a schematic structural view of the thin film transistor formed after steps S242 to S252 of the second way to form the insulating spacer layer shown in FIG. 9.

Combined referring to FIG. 10, FIG. 10 is a schematic structural view of the thin film transistor formed after steps S242 to S252 of the second way to form the insulating spacer layer shown in FIG. 9; the semiconductor layer 140 is disposed on a side of the insulating layer 130 away from the gate electrode layer 120. The conductive layer 150 is disposed on a side the semiconductor layer 140 away from the insulating layer 130. The insulating spacer layer 160 is disposed on the two terminals of the semiconductor layer 140, the source-drain electrode layer 170 is disposed above the conductor layer 150 and the insulating spacer layer 160, the passivation layer 180 is disposed above the source-drain electrode layer 170, the semiconductor layer 140, and the insulating spacer layer 160, and the other reference characters in FIG. 10 are the same as those designated in FIG. 6.

The method for manufacturing the thin film transistor of the present embodiment includes preparing a substrate, disposing a gate electrode layer and an insulating layer on the substrate, sequentially disposing a semiconductor layer and a conductor layer on the insulating layer, disposing an insulating spacer layer on the insulating layer, disposing a source-drain electrode layer on the conductor layer and the insulating spacer layer, disposing a passivation layer on the source-drain electrode layer and the semiconductor layer, by disposing the insulating spacer layer on the insulating layer, to form the insulating spacer layer having a height greater than or equal to the height of the semiconductor layer at the sidewalls or both terminals of the semiconductor layer, and has an effect of preventing the contacting of the source-drain electrode layer and the semiconductor layer resulting in the condition of increasing leakage path, and to reduce the leakage current.

Figure 11:
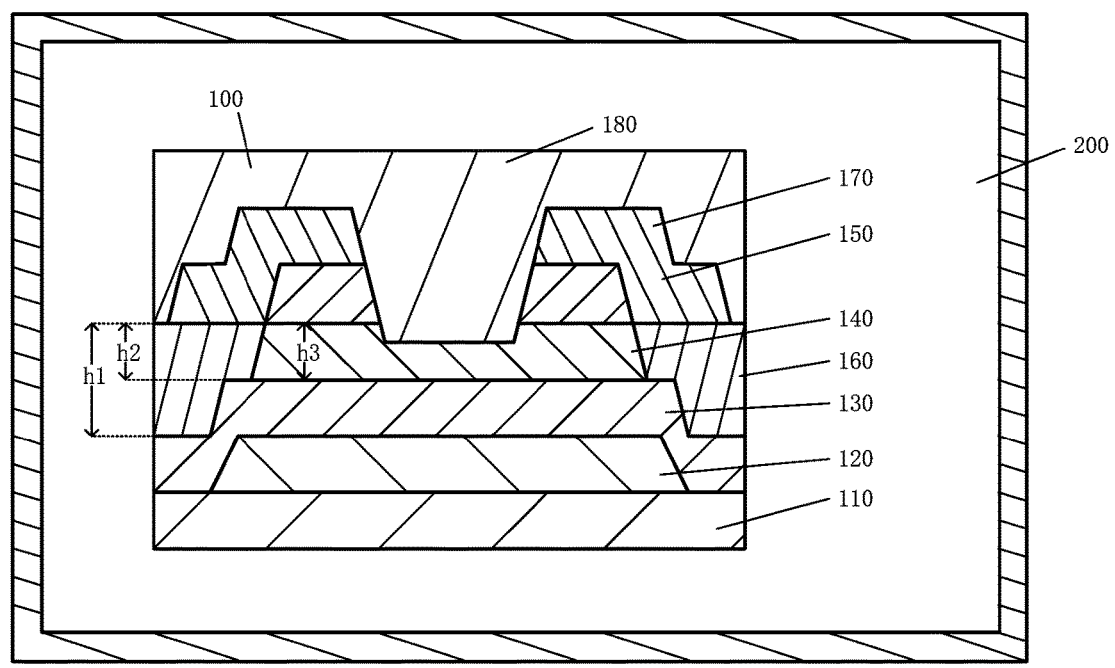
FIG. 11 is a schematic view showing a structure of a liquid crystal display panel according to an embodiment of the present application.
Figure 12:
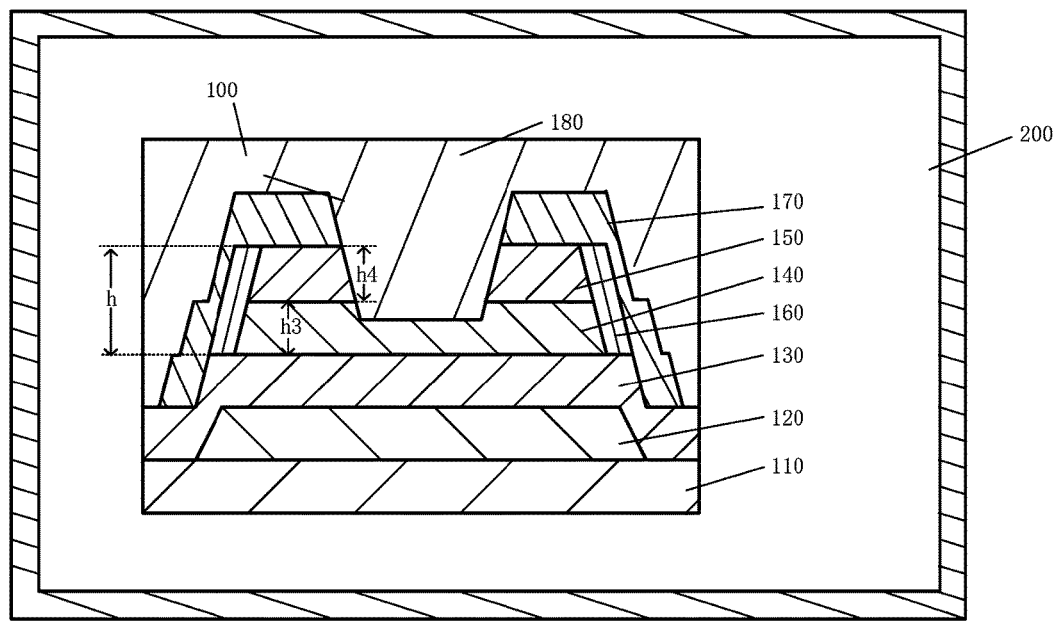
FIG. 12 is a schematic structural view of a liquid crystal display panel according to another embodiment of the present application.

Referring to FIGS. 11 and 12, FIG. 11 is a schematic structural view of a liquid crystal display panel according to an embodiment of the present application, and FIG. 12 is a schematic structural view of a liquid crystal display panel according to another embodiment of the present application.

In the two embodiments of FIGS. 11 and 12, the liquid crystal display panel includes the thin film transistor described above, and the difference between the liquid crystal display panels in FIGS. 11 and 12 is only the shape of the insulating spacer layer of the thin film transistor in the liquid crystal display panel. Therefore, the reference characters in the two embodiments of FIGS. 11 and 12 are the same as those designated in FIGS. 1 and 2.

The thin film transistor 100 in the liquid crystal display panel 200 is a laminated structure, and the layers described above are sequentially disposed on the substrate 110, and the substrate 110 may be a glass substrate. Wherein the gate electrode layer 120 is disposed on the substrate 110, the insulating layer 130 is covered the gate electrode layer 120. In this embodiment, the thin film transistor 100 is a bottom gate structure.

The semiconductor layer 140 is disposed on the insulating layer 130 and as an active layer of the thin film transistor 100; the conductor layer 150 is disposed on the semiconductor layer 140 for connecting the semiconductor layer and the source-drain electrode layer 170; a current is formed between the source-drain electrode layer 170 through the conductive layer 150 and by the semiconductor layer 140, in this embodiment, the resistance of the conductor layer 150 is smaller, compared to the source-drain electrode layer 170 directly connected to the semiconductor layer 140 to reduce the leakage current condition between the source-drain electrode layer 170 and the semiconductor layer 140.

The insulating spacer layer 160 is further disposed on the insulating layer 130 in the present embodiment, that is, the insulating spacer layer 160 is disposed on the same layer with the semiconductor layer 140; the source-drain electrode layer 170 is disposed on the conductor layer 150 and the insulating spacer layer 160, and the insulating spacer layer 160 is located between the semiconductor layer 140 and the source-drain electrode layer 170.

In the embodiment, the conductor layer 150 and the insulating spacer layer 160 are provided between the semiconductor layer 140 and the source-drain electrode layer 170, that is, the semiconductor layer 140 and the source-drain electrode layer 170 is not directly contacting and connected, so that the leakage current between the semiconductor layer 140 and the source-drain electrode layer 170 can be effectively reduced.

The semiconductor layer 140 has a channel region 141, the channel region 141 divides the semiconductor layer 140 into left and right portions, the conductor layer 150 is disposed on the left and right portions of the semiconductor layer 140 to form two island structures. The source-drain electrode layer 170 disposed on the two island structures of the conductor layer 150 are also divided into a source electrode and a drain electrode.

The passivation layer 180 is disposed on the source-drain electrode layer 170 and the semiconductor layer 140, specifically is disposed on the channel region 141 of the semiconductor 140 and is formed between the two island structures of the conductor layer 150.

For the structure of the thin film transistor 100 described above, the insulating layer 130, the insulating spacer layer 160, and the passivation layer 180 are all insulating materials, and may be silicon oxide or silicon nitride. The gate electrode layer 120 and the source-drain electrode layer 170 are metal materials, and may be metal materials such as molybdenum and aluminum and etc., and also may be a combination of three layers of molybdenum-aluminum-molybdenum metal materials. The semiconductor layer 140 may be polysilicon, and the conductor layer 150 may be a P+ conductor layer formed of polysilicon doped with Boron ions.

In addition, the insulating spacer layer 160 of the present application may be disposed on the insulating layer 130 in a variety of ways, for example, in the two types shown in FIGS. 11 and 12.

As shown in FIG. 11, the insulating spacer layer 160 is disposed on the insulating layer 130, and has a first thickness h1 and a second thickness h2, the second thickness h2 is smaller than the first thickness h1, and the second thickness h2 is greater than or equal to the thickness h3 of the semiconductor layer 140, the second thickness h2 of the insulating spacer layer in FIG. 11 is equal to the thickness h3 of the semiconductor layer 140. The structure of the insulating spacer layer 160 shown in FIG. 11 makes the source-drain electrode layer 170 not disposed on the insulating layer 130, and then increases to the distance between the source-drain electrode layer 170 and the gate electrode layer 120, to prevent breakdown, and to reduce the parasitic capacitance between the source-drain electrode layer 170 and the gate electrode layer 120. In FIG. 11, the formed passivation layer 180 is further disposed on the insulating spacer layer 160.

As shown in FIG. 12, the insulating spacer layer 160 is disposed on the side face of the semiconductor layer 140 and the conductor layer 150, and is disposed on the insulating layer 130, the thickness h thereof may be greater than or equal to the thickness h3 of the semiconductor layer 140. The thickness h of the insulating spacer layer in FIG. 12 is greater than the thickness h3 of the semiconductor layer 140, and is equal to the combination thickness h3+h4 of both the semiconductor layer 140 and the conductor layer 150. The structure of the insulating spacer layer 160 shown in FIG. 12 makes the source-drain electrode layer 170 further disposed on the insulating layer 130, the insulating spacer layer 160 is capable of disposed between the conductor layer 150 and the source-drain electrode layer 170, the passivation layer 180 is further disposed on the insulating layer 130.

In the above embodiment, the insulating spacer layer of the thin film transistor in the liquid crystal display panel is located between the source-drain electrode layer and the semiconductor layer to prevent the direct contact between the source-drain electrode layer and the semiconductor layer, reduce the leakage current, thereby improving the performance of the thin film transistor.

Above are embodiments of the present application, which does not limit the scope of the present application. Any modifications, equivalent replacements or improvements within the spirit and principles of the embodiment described above should be covered by the protected scope of the invention.

What is claimed is:

1. A liquid crystal display panel comprising a thin film transistor, wherein the thin film transistor comprises:
    a substrate, a gate electrode layer and an insulating layer, wherein the gate electrode layer is disposed on the substrate, the insulating layer covers the gate electrode layer;
    a semiconductor layer is disposed on the insulating layer;
    a conductor layer is disposed on the semiconductor layer;
    the semiconductor layer comprises a channel region, the channel region divides the semiconductor layer into left and right portions, the conductor layer is disposed on the left and right portions of the semiconductor layer to form two island structures;
    an insulating spacer layer is disposed on the insulating layer;
    a source-drain electrode layer is disposed on the conductor layer and the insulating spacer layer;
    a passivation layer is disposed on the source-drain electrode layer and the semiconductor layer;
    wherein the insulating spacer layer is disposed between the source-drain electrode layer and the semiconductor layer;
    the gate electrode layer and the source-drain electrode layer are metal material; and
    the insulating layer, the insulating spacer layer and the passivation layer are insulating materials;
    the passivation layer is disposed above the insulating spacer layer, and the insulating spacer layer comprises a first thickness and a second thickness, the second thickness is smaller than the first thickness, and the second thickness is greater than or equal to the thickness of the semiconductor layer.

2. The liquid crystal display panel according to claim 1, wherein the source-drain electrode layer is further disposed on the insulating layer, the insulating spacer layer is located between the semiconductor layer and the source-drain electrode layer, and the passivation layer is disposed above the insulating layer.

3. The liquid crystal display panel according to claim 2, wherein the thickness of the insulating spacer layer is greater than or equal to the thickness of the semiconductor layer.

4. The liquid crystal display panel according to claim 1, wherein the insulating spacer layer comprises silicon oxide or silicon nitride.

5. A thin film transistor, comprising:
a substrate, a gate electrode layer and an insulating layer, wherein the gate electrode layer disposed on the substrate, the insulating layer covers the gate electrode layer;
a semiconductor layer disposed on the insulating layer;
a conductor layer disposed on the semiconductor layer;
an insulating spacer layer disposed on the insulating layer;
a source-drain electrode layer disposed on the conductor layer and the insulating spacer layer;
a passivation layer disposed on the source-drain electrode layer and the semiconductor layer; and
wherein the insulating spacer layer disposed between the source-drain electrode layer and the semiconductor layer;
the passivation layer is further disposed above the insulating spacer layer, and the insulating spacer layer comprises a first thickness and a second thickness, the second thickness is smaller than the first thickness, and the second thickness is greater than or equal to the thickness of the semiconductor layer.

6. The thin film transistor according to claim 5, wherein the source-drain electrode layer is further disposed on the insulating layer, the insulating spacer layer is located between the semiconductor layer and the source-drain electrode layer, and the passivation layer is disposed above the insulating layer.

7. The thin film transistor according to claim 6, wherein the thickness of the insulating spacer layer is greater than or equal to the thickness of the semiconductor layer.

8. The thin film transistor according to claim 5, wherein the insulating spacer layer comprises silicon oxide or silicon nitride.

* * * * *